(12) United States Patent
Nguyen et al.

(10) Patent No.: US 7,011,890 B2
(45) Date of Patent: Mar. 14, 2006

(54) MODULATED/COMPOSITED CVD LOW-K FILMS WITH IMPROVED MECHANICAL AND ELECTRICAL PROPERTIES FOR NANOELECTRONIC DEVICES

(75) Inventors: Son Van Nguyen, Los Gatos, CA (US); Yi Zheng, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/378,783

(22) Filed: Mar. 3, 2003

(65) Prior Publication Data

US 2004/0175581 A1 Sep. 9, 2004

(51) Int. Cl.
B32B 25/20 (2006.01)
B05D 3/06 (2006.01)

(52) U.S. Cl. .............. 428/447; 426/131; 427/101; 427/387; 427/470; 427/489; 427/494; 427/495; 427/508; 427/515; 427/595

(58) Field of Classification Search ............. 427/470, 427/489, 494, 495, 508, 515, 595, 101, 387; 428/131, 447
See application file for complete search history.

(56) References Cited

U.S. PATENT DOCUMENTS

| | | | |
|---|---|---|---|
| 5,003,178 A | 3/1991 | Livesay ............. 250/492.3 |
| 5,504,040 A | 4/1996 | Moslehi | |
| 5,638,251 A | 6/1997 | Goel et al. .............. 361/313 |
| 5,855,681 A | 1/1999 | Maydan et al. .......... 118/719 |
| 6,068,884 A | 5/2000 | Rose et al. ............. 427/255.6 |
| 6,072,227 A | 6/2000 | Yau et al. .............. 257/642 |
| 6,147,009 A | 11/2000 | Grill et al. .............. 438/780 |
| 6,159,871 A | 12/2000 | Loboda et al. .......... 438/786 |
| 6,245,690 B1 * | 6/2001 | Yau et al. .............. 438/780 |
| 6,287,990 B1 | 9/2001 | Cheung et al. .......... 438/780 |
| 6,303,523 B1 | 10/2001 | Cheung et al. .......... 438/780 |
| 6,312,793 B1 | 11/2001 | Grill et al. ............ 428/312.6 |
| 6,340,435 B1 | 1/2002 | Bjorkman et al. ........ 216/72 |
| 6,340,628 B1 | 1/2002 | Van Cleemput et al. ... 438/586 |
| 6,348,725 B1 | 2/2002 | Cheung et al. .......... 257/642 |
| 6,413,583 B1 | 7/2002 | Moghadam et al. | |
| 6,437,443 B1 | 8/2002 | Grill et al. ............ 257/758 |
| 6,441,491 B1 | 8/2002 | Grill et al. ............ 257/759 |
| 6,479,110 B1 | 11/2002 | Grill et al. ............ 427/577 |
| 6,479,409 B1 | 11/2002 | Shioya et al. .......... 438/790 |
| 6,486,082 B1 | 11/2002 | Cho et al. | |
| 6,541,398 B1 | 4/2003 | Grill et al. | |
| 6,562,690 B1 | 5/2003 | Cheung et al. .......... 438/400 |
| 6,582,777 B1 | 6/2003 | Ross et al. | |
| 6,583,048 B1 | 6/2003 | Vincent et al. | |
| 6,605,549 B1 | 8/2003 | Leu et al. | |
| 6,733,830 B1 | 5/2004 | Todd | |
| 6,756,323 B1 | 6/2004 | Grill et al. | |
| 2002/0037442 A1 | 3/2002 | Grill et al. | |
| 2002/0106846 A1 | 8/2002 | Seutter et al. .......... 438/200 |
| 2002/0137359 A1 | 9/2002 | Grill et al. ............ 438/778 |
| 2002/0142579 A1 | 10/2002 | Vincent et al. .......... 438/623 |
| 2003/0040195 A1 | 2/2003 | Chang et al. .......... 438/782 |
| 2003/0186561 A1 | 10/2003 | Law et al. | |
| 2003/0194495 A1 | 10/2003 | Li et al. | |
| 2003/0198742 A1 | 10/2003 | Vrtis et al. | |
| 2003/0232495 A1 | 12/2003 | Moghadam et al. | |
| 2004/0082193 A1 | 4/2004 | Rocha-Alvarez et al. | |
| 2004/0096593 A1 | 5/2004 | Lukas et al. | |
| 2004/0096672 A1 | 5/2004 | Lukas et al. | |
| 2004/0101632 A1 | 5/2004 | Zhu et al. | |
| 2004/0101633 A1 | 5/2004 | Zheng et al. | |
| 2004/0152338 A1 * | 8/2004 | Gaillard et al. .......... 438/778 |
| 2004/0161535 A1 | 8/2004 | Goundar et al. | |

FOREIGN PATENT DOCUMENTS

| | | |
|---|---|---|
| EP | 1 148 539 A2 | 10/2001 |
| WO | WO 9941423 A2 * | 8/1999 |
| WO | WO 02/43119 A2 | 5/2002 |

OTHER PUBLICATIONS

U.S. Appl. No. 10/355, 379, filed Jan. 31, 2003.
U.S. Appl. No. 10/302,375, filed Nov. 22, 2002.
U.S. Appl. No. 10/302,393, filed Nov. 22, 2002.
PCT International Search Report for PCT/US2004/006265, dated Sep. 1, 2004.
Grant M. Kloster, et al. "Porosity Effects on Low-K Dielectric Film Strength and Interfacial Adhesion," International Interconnect Technology Conference, Jun. 5, 2002, pp. 1-17.

* cited by examiner

*Primary Examiner*—Jeffrey B. Robertson
(74) *Attorney, Agent, or Firm*—Patterson & Sheridan

(57) ABSTRACT

A method for depositing a low dielectric constant film is provided. The low dielectric constant film includes alternating sublayers, which include at least one carbon-doped silicon oxide sublayer. The sublayers are deposited by a plasma process than includes pulses of RF power. The alternating sublayers are deposited from two or more compounds that include at least one organosilicon compound. The two or more compounds and processing conditions are selected such that adjacent sublayers have different and improved mechanical properties.

33 Claims, 3 Drawing Sheets

MODULATED/COMPOSITED CVD LOW-K FILMS WITH IMPROVED MECHANICAL AND ELECTRICAL PROPERTIES FOR NANOELECTRONIC DEVICES

BACKGROUND OF THE INVENTION

1. Field of the Invention

Embodiments of the present invention relate to the fabrication of integrated circuits. More particularly, embodiments of the present invention relate to a process for depositing a dielectric film on a substrate.

2. Description of the Related Art

Integrated circuit geometries have dramatically decreased in size since such devices were first introduced several decades ago. Since then, integrated circuits have generally followed the two year/half-size rule (often called Moore's Law), which means that the number of devices on a chip doubles every two years. Today's fabrication facilities are routinely producing devices having 0.13 $\mu$m and even 0.1 $\mu$m feature sizes, and tomorrow's facilities soon will be producing devices having even smaller feature sizes.

The continued reduction in device geometries has generated a demand for films having lower k values because the capacitive coupling between adjacent metal lines must be reduced to further reduce the size of devices on integrated circuits. In particular, insulators having low dielectric constants (k), less than about 4.0, are desirable. Examples of insulators having low dielectric constants include spin-on glass, such as un-doped silicon glass (USG) or fluorine-doped silicon glass (FSG), silicon dioxide, and polytetrafluoroethylene (PTFE), which are all commercially available.

Increasing the porosity of dielectric films is one approach that is being pursued to develop dielectric films having lower k values. However, it can be difficult to deposit a low k dielectric film that has both enough pores to reduce the k to a desired level and the mechanical strength to withstand further integrated circuit fabrication processing steps.

There is a need, therefore, for a method of depositing a low k dielectric film with good mechanical properties.

SUMMARY OF THE INVENTION

Embodiments of the present invention generally provide a method of depositing a low k dielectric film on a substrate that includes exposing two or more compounds, including at least one organosilicon compound, to pulsed RF power to deposit alternating low k dielectric sublayers on the substrate. The method provides a low k dielectric film comprising at least a carbon-doped silicon oxide sublayer that is about 1 nanometer to about 100 nanometers thick. Various low k dielectric sublayers are deposited under conditions such that each sublayer retains some of the chemical and/or mechanical properties of a compound from which it was deposited. The low k dielectric sublayers are deposited such that adjacent sublayers have different chemical and/or mechanical properties. Thus, a mechanical weakness in one sublayer may be compensated for by the different mechanical properties of the adjacent sublayers.

In one embodiment, a method of depositing a low k dielectric film on a substrate includes simultaneously exposing two or more compounds, including at least one organosilicon compound, to pulsed RF power to deposit alternating low k dielectric sublayers on the substrate. The pulsed RF power includes pulses delivered for a first period of time at a first frequency to deposit a sublayer primarily from one of the compounds and pulses delivered for a second period of time at a second frequency to deposit a sublayer primarily from another one of the compounds.

In another embodiment, computer storage media containing software that causes a computer to direct the low k dielectric film deposition methods described herein are provided.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the present invention generally provide a low k dielectric film and a method of depositing a low k dielectric film. Generally, two or more compounds are introduced into a processing chamber and exposed to pulsed RF power to form alternating low k dielectric sublayers on a substrate in the processing chamber. The two or more low k dielectric sublayers form a multilayer low k dielectric film. Preferably, the sublayers are about 1 nanometer to about 100 nanometers thick. Most preferably, two alternating sublayers that are each about 10 nanometers thick are deposited.

The low k dielectric film may be deposited in any processing chamber in which pulsed RF power can be applied. For sublayers close to 1 nanometer in thickness, the low k dielectric film can be deposited in an atomic layer deposition chamber. An example of an atomic layer deposition chamber that may be used is described in commonly assigned U.S. patent application Ser. No. 09/776,329, entitled "Formation of a Tantalum-Nitride Layer," filed on Feb. 2, 2001 now U.S. Pat. No. 6,951,804, which is incorporated herein by reference. Preferably, the low k dielectric film is deposited in a chemical vapor deposition chamber, such as a Producer® or Producer® SE chemical vapor deposition (CVD) chamber, available from Applied Materials, Inc., Santa Clara, Calif., using plasma enhanced chemical vapor deposition.

Figure 1:
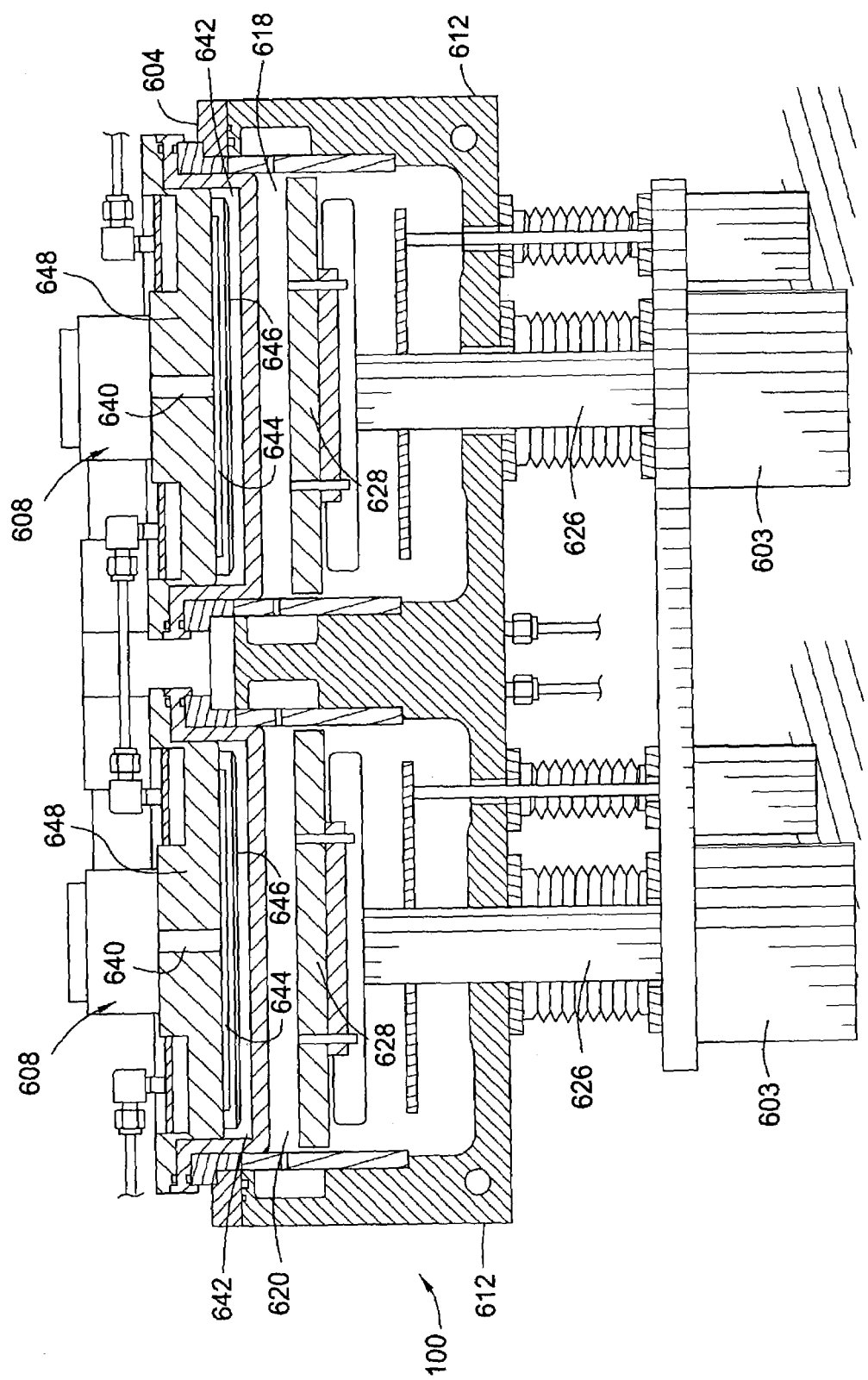
FIG. 1 is a cross sectional view of one embodiment of a deposition chamber.

The Producer® CVD chamber (200 mm or 300 mm) has two isolated processing regions that may be used to deposit carbon-doped silicon oxides and other materials. A chamber having two isolated processing regions is described in U.S. Pat. No. 5,855,681, which is incorporated by reference herein. FIG. 1 shows a cross sectional view of a Producer® CVD chamber 100. The chamber 100 has processing regions 618 and 620. A heater pedestal 628 is movably disposed in each processing region 618, 620 by a stem 626 which extends through the bottom of the chamber body 612 where it is connected to a drive system 603. Each of the processing regions 618, 620 also preferably include a gas distribution assembly 608 disposed through the chamber lid 604 to deliver gases into the processing regions 618, 620. The gas distribution assembly 608 of each processing region also includes a gas inlet passage 640 which delivers gas into a shower head assembly 642. The showerhead assembly 642 is comprised of an annular base plate 648 having a blocker plate 644 disposed intermediate a face plate 646. An RF (radio frequency) feedthrough provides a bias potential to the showerhead assembly to facilitate generation of a plasma between the face plate 646 of the showerhead assembly and the heater pedestal 628.

The two or more compounds that are exposed to pulsed RF power include at least one organosilicon compound. The organosilicon compound may have a ring structure, linear structure, or fullerene structure. Examples of organosilicon compounds that may be used that have ring structures include octamethylcyclotetrasiloxane, 1,3,5,7-tetramethylcyclotetrasiloxane, 1,2,3,4-tetramethylcyclotetrasilane, hexaethylcyclotrisiloxane, hexamethylcyclotrisiloxane, hexaphenylcyclotrisiloxane, 1,3,7-tetravinyl-1,3,5,7-tetramethylcyclotetrasiloxane, 1,3,5,7,9-pentamethylcyclopentasiloxane, 1,3,5,7,9-pentavinyl,-1,3,5,7,9-pentamethylcyclopentasiloxane, and octamethylcyclotetrasilazane. Examples of organosilicon compounds that may be used that have linear structures include trimethylsilane, tetramethylsilane, 1,1,3,3-tetramethyldisiloxane, tetravinylsilane, diphenylmethylsilane, tetraphenylsilane, tetra-n-propoxysilane, diethoxymethylsilane, 1,1,3,3,-tetramethyl-1,3-diethoxydisiloxane, and 1,1,3,3-tetramethyldisilazane. tetramethyldisilazane Examples of organosilicon compounds that may be used that have fullerene structures, e.g., spherical or cuboidal structures, include silsequioxane structures, such as hydro-T8-silsesquioxane, octamethyl-T8-silsequioxane, octavinyl-T8-silsesquioxane, and octakis(dimethylsiloxy)-T8-silsesquioxane. If an organosilicon compound having a ring structure or fullerene structure is used, the organosilicon compound can be dissolved in a solvent such as hexane before introducing the compound into the CVD chamber.

The two or more compounds may also include a hydrocarbon. The hydrocarbon may have a ring structure, linear structure, or fullerene structure. Examples of types of hydrocarbons that may be used that have ring structures include cyclic terpenes, cyclopentenes, cyclohexenes, cyclohexanes, cyclohexadienes, cycloheptadienes, and phenyl-containing compounds. For example, alpha terpinene ($C_{10}H_{16}$) (ATP), 1-methyl-4-(1-methylethenyl)-cyclohexene, 1-methyl-4-isopropylcyclohexane, p-isopropyltoluene, vinylcyclohexane, norbornadiene, phenyl acetate, cyclopentene oxide, and combinations thereof may be used. Examples of hydrocarbons that may be used that have linear structures include ethylene, hexane, propylene, and 1,3-butadiene. Examples of hydrocarbons that may be used that have fullerene structures include C60, C70, C76, and C78. If a hydrocarbon having a ring structure or a fullerene structure is used, the hydrocarbon can be dissolved in a solvent such as hexane and tetrahydrofuran before introducing the compound into the CVD chamber.

Preferably, oxygen is present in at least one of the low k dielectric sublayers, which is a carbon-doped silicon oxide sublayer. One or more of the two or more compounds exposed to RF power may include oxygen to provide a source of oxygen for one or more of the sublayers. Alternatively or additionally, oxygen and/or an oxidizing gas, such as carbon dioxide, may also be exposed to the RF power.

Preferably, the low k dielectric film is a carbon-doped silicon oxide film that includes about 10% to about 60% silicon, about 20% to about 30% oxygen, and about 10% to about 60% carbon. Preferably, the low k dielectric film is a porous carbon-doped silicon oxide film that has a k<3.0. However, it is recognized that other types of low k dielectric films can be deposited using the methods described herein.

In a preferred embodiment, the two or more compounds, such as two or more organosilicon compounds, are simultaneously exposed to pulsed RF power in a deposition chamber. The pulsed RF power is delivered at different frequencies. For example, the RF power is delivered at a first frequency, such as about 350 kHz to about 100 MHz, for a first period of time, such as about 1 second to about 30 seconds and then delivered at a second frequency (different than the first frequency), such as about 350 kHz to about 100 MHz, for a second period of time, such as about 1 second to about 30 seconds. The RF power level may be about 50 watts to about 3000 watts. The duty cycle may be about 5% to about 60%. The organosilicon flow rates may be about 50 sccm to about 5000 sccm. Oxidizing gas flow rates may be from 0 sccm to about 3000 sccm, and hydrocarbon flow rates may from 0 sccm to about 5000 sccm. Preferably, the first and second frequencies are chosen such that a first sublayer is deposited on a substrate in the chamber primarily from one of the two or more compounds, e.g., compound A, and the second sublayer is deposited on the first sublayer primarily from another one of the two or more compounds, e.g., compound B. Typically, compounds A and B have sufficiently different chemical or physical properties such that A primarily contributes to the deposition of one sublayer during pulses at a first frequency, while B primarily contributes to the deposition of an adjacent sublayer during pulses at a second frequency. As used herein, deposition of a layer "primarily" or "substantially" from a compound A means that the source of at least 50% of the material of the layer is compound A. Thus, while the majority of the layer is deposited from compound A and has the characteristics of compound A, other precursor compounds, such as compound B, may contribute to the formation of the layer.

By using pulsed RF power rather than continuous RF power during the deposition of the sublayers, the compounds exposed to the RF power are not broken down completely. Thus, a sublayer formed primarily from one compound retains some of the chemical and physical characteristics of the compound from which it was primarily deposited. For example, a sublayer deposited from a compound having a ring structure is expected to include ring structures, while a sublayer deposited from a compound having a linear structure is expected to include linear structures.

It is believed that depositing adjacent sublayers having different types of structures contributes to the formation of a multilayer low k dielectric film that has adjacent sublayers with different mechanical properties, such as compressive stress, tensile stress, modulus, adhesion, and hardness. By using thin adjacent layers with different properties, a mechanical or structural weakness in one layer can be compensated for by the different characteristics of an adjacent layer.

While the deposition of two types of sublayers from compounds A and B has been described above, additional types of sublayers may be deposited by using additional compounds, C, D, E, etc. For example, a sublayer may be deposited from compound C by exposing C with A and B to pulsed RF power at a different frequency than the frequencies used to deposit sublayers from A and B. Alternatively, C may be added to the chamber after the flow of A and B into the chamber has been terminated and then deposited at a certain frequency using pulsed RF power. Some A and B may still be present in the chamber when C is introduced, or the chamber may be purged, such as with a carrier gas, before C is introduced.

In another embodiment, a low k dielectric film may be deposited by exposing two or more compounds sequentially to pulsed RF power. For example, compound A may be introduced into a chamber and exposed to pulsed RF power at one frequency to deposit a first low k dielectric sublayer, and then compound B may be introduced into the chamber and exposed to pulsed RF power at a second frequency to deposit a second low k dielectric sublayer. Alternatively, a first sublayer may be deposited from a first processing gas mixture comprising compound A and applying pulsed RF power at one frequency, and a second and third sublayer may be deposited from a second processing gas mixture comprising compounds B and C and applying pulsed RF power at two different frequencies. The two or more compounds may be continuously flowed into the chamber or delivered in pulses.

In another embodiment, a first group of one or more compounds, preferably two or more compounds, may be exposed to pulsed RF power at a first frequency in a first chamber to form a first low k dielectric sublayer, and a second group of one or more compounds, preferably two or more compounds, that includes at least one different member than the first group of compounds may be exposed to pulsed RF power at a second frequency in a second chamber to form a second low k dielectric sublayer.

In any of the embodiments described herein, after the desired number of sublayers is deposited, the low k dielectric film formed by the sublayers may be treated with an electron beam or a helium or hydrogen plasma treatment. Preferably, the low k dielectric film is transferred to another chamber without breaking vacuum for an electron beam treatment or a helium or hydrogen plasma treatment. An electron beam treatment and chamber for low k dielectric films is described in commonly assigned U.S. patent application Ser. No. 10/302,375, entitled "Method For Forming Ultra Low K Films Using Electron Beam," filed on Nov. 22, 2002 now abandoned, which is incorporated herein by reference. In one embodiment, the electron beam treatment has a dose between about 50 and about 2000 micro coulombs per square centimeter ($\mu c/cm^2$) at about 1 to 20 kiloelectron volts (KeV). The electron beam treatment is typically operated at a temperature between about room-temperature and about 450° C. for about 1 minute to about 15 minutes, such as about 2 minutes. Preferably, the electron beam treatment is performed at about 400° C. for about 2 minutes. In one aspect, the electron beam treatment conditions include 4.5 kV, 1.5 mA and 500 $\mu c/cm^2$ at 400 C. Although any electron beam device may be used, one exemplary device is the EBK chamber, available from Applied Materials, Inc.

The electron beam curing process improves mechanical strength of the deposited film network and also lowers the k-value. It is believed that the energized electron beam alters the chemical bonding in the molecular network of the deposited film and removes at least a portion of the molecular groups from the film. The removal of the molecular groups creates voids or pores within the film, lowering the k value. It is believed that the electron beam treatment also strengthens the film network by cross-linking Si—O—Si or Si—C—Si chains, as inferred from FTIR spectroscopy.

The low k dielectric films described herein may be used as intermetal dielectric layers, such as between conductive interconnects in an integrated circuit device. The low k dielectric films may be used as different layers in a dual damascene structure, such as a trench level dielectric layer or a via level dielectric layer, a cap layer, a hard mask, an etch stop, or a chemical mechanical polishing stop.

Figure 2:
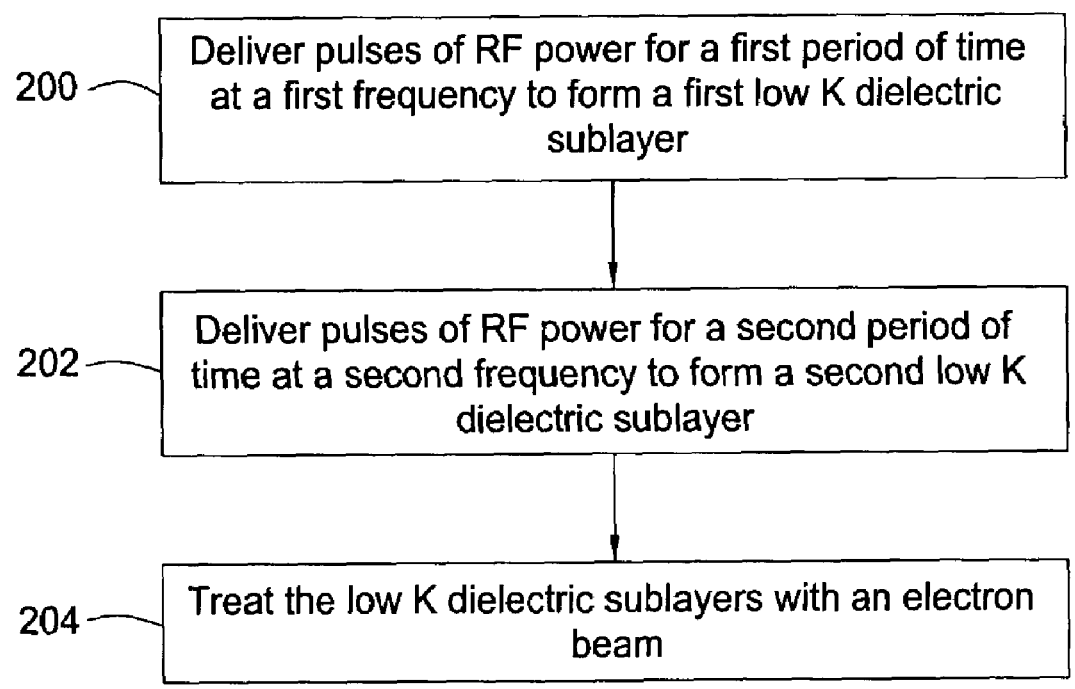
FIG. 2 is an illustrative flow chart of processes performed by a computer system in an embodiment.

The low k dielectric films described herein may be deposited using a computer storage medium containing a software routine that, when executed, causes a general purpose computer to control a deposition chamber using a deposition method. The software routine may comprise instructions for depositing any of the low k dielectric films according to any of the embodiments described herein. An example of a deposition process performed according to one embodiment of a computer storage medium containing such a software routine is summarized in FIG. 2.

Two or more compounds in a deposition chamber are exposed to pulsed RF power. At least one of the compounds is an organosilicon compound. Pulses of RF power are delivered for a first period of time at a first frequency to form a first low k dielectric sublayer, as shown in step 200 of FIG. 2. Pulses of RF power are delivered for a second period of time at a second frequency to form a second low k dielectric sublayer, as shown in step 202 of FIG. 2. The low k dielectric sublayers form a low k dielectric film which is treated with an electron beam, as shown in step 204 of FIG. 2.

Figure 3:
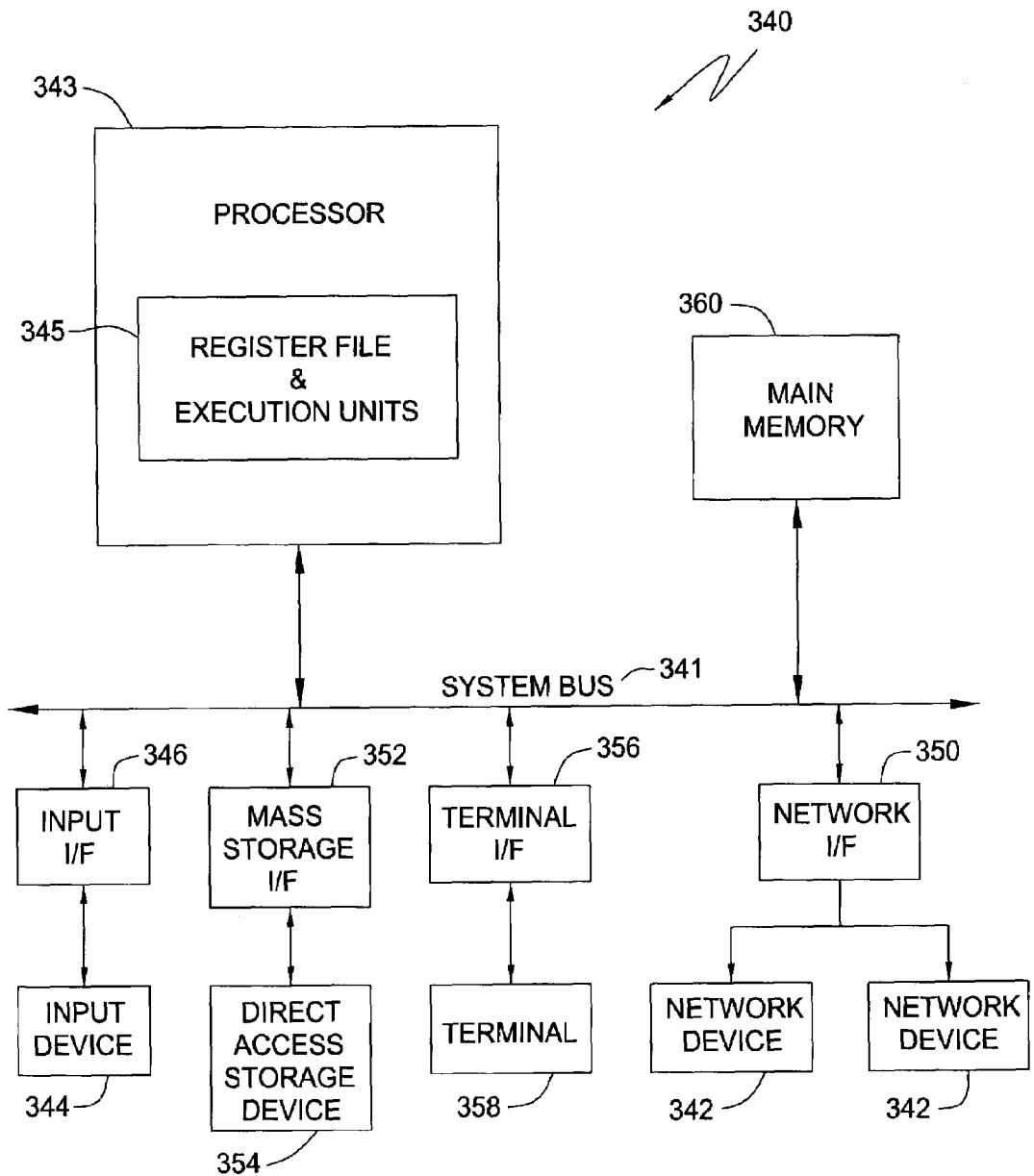
FIG. 3 is a computer system according to an embodiment.

An example of a computer system that may be used to execute the software routines described herein is shown in FIG. 3. Illustratively, the computer system 340 includes a system bus 341 and at least one processor 343 coupled to the system bus 341. The processor 343 includes register file and execution units 345. The computer system 340 also includes an input device 344 coupled to the system bus 341 via an input interface 346, a storage device 354 coupled to the system bus 341 via a mass storage interface 352, a terminal 358 coupled to the system bus 341 via a terminal interface 356, and a plurality of networked devices 342 coupled to the system bus 341 via a network interface 350.

Terminal 358 is any display device such as a cathode ray tube (CRT) or a plasma screen. Terminal 358 and networked devices 342 may be desktop or PC-based computers, workstations, network terminals, or other networked computer systems. Input device 344 can be any device to give input to the computer system 340. For example, a keyboard, keypad, light pen, touch screen, button, mouse, track ball, or speech recognition unit could be used. Further, although shown separately from the input device, the terminal 358 and input device 344 could be combined. For example, a display screen with an integrated touch screen, a display with an integrated keyboard or a speech recognition unit combined with a text speech converter could be used.

Storage device 354 is DASD (Direct Access Storage Device), although it could be any other storage such as floppy disc drives or optical storage. Although storage 354 is shown as a single unit, it could be any combination of fixed and/or removable storage devices, such as fixed disc drives, floppy disc drives, tape drives, removable memory cards, or optical storage. Main memory 360 and storage device 354 could be part of one virtual address space spanning multiple primary and secondary storage devices.

The contents of main memory 360 can be loaded from and stored to the storage device 354 as processor 343 has a need for it. Main memory 360 is any memory device sufficiently large to hold the necessary programming and data structures of the invention. The main memory 360 could be one or a combination of memory devices, including random access memory (RAM), non-volatile or backup memory such as programmable or flash memory or read-only memory (ROM). The main memory 360 may be physically located in another part of the computer system 340. While main memory 360 is shown as a single entity, it should be understood that memory 360 may in fact comprise a plurality of modules, and that main memory 360 may exist at multiple levels, from high speed registers and caches to lower speed but larger DRAM chips.

In general, the routines executed to implement the embodiments of the invention may be implemented as part of an operating system or a specific application, component, program, object, module or sequence of instructions and may be generally referred to as a "program". The inventive program typically comprises one or more instructions that are resident at various times in various memory and storage devices in a computer, and that, when read and executed by one or more processors in a computer, cause that computer to perform the steps necessary to execute steps or elements embodying the various aspects of the invention.

In addition, various programs and devices described herein may be identified based upon the application for which they are implemented in a specific embodiment of the invention. However, it should be appreciated that any particular program or device nomenclature that follows is used merely for convenience, and the invention is not limited to use solely in any specific application identified and/or implied by such nomenclature.

Moreover, while some embodiments have and hereinafter will be described in the context of fully functioning computers and computer systems, those skilled in the art will appreciate that the various embodiments of the invention are capable of being distributed as a program product in a variety of forms, and that embodiments of the invention apply equally regardless of the particular type of signal bearing media used to actually carry out the distribution. Examples of signal bearing media (also referred to herein as computer readable medium) include, but are not limited to, recordable type media such as volatile and nonvolatile memory devices, floppy and other removable disks, hard disk drives, optical disks (e.g., CD-ROMs, DVDs, etc.), controllers and transmission type media such as digital and analog communication links. Transmission type media include information conveyed to a computer by a communications medium, such as through a computer or telephone network, and includes wireless communications. The latter embodiment specifically includes information downloaded from the Internet and other networks. Such signal-bearing media, when carrying computer-readable instructions that direct the functions of the present invention, represent embodiments of the present invention.

An example of a low k dielectric film and a method of depositing a low k dielectric film are described below.

EXAMPLE

Octamethylcyclotetrasiloxane (OMCTS), diethoxymethylsilane (DEMS), alpha-terpinene (ATP), and carbon dioxide were simultaneously introduced into a Producer® CVD chamber in which pulsed RF power was applied between the face plate and the pedestal at a power of about 800 watts at 13.56 MHz and 150 watts at 350 kHz. The OMCTS was introduced into the chamber at 2000 sccm, the DEMS was introduced into the chamber at 600 mgm, the carbon dioxide was introduced into the chamber at 1500 sccm, and the ATP was introduced into the chamber at 3000 mgm. The chamber temperature was about 200° C. to about 350° C. The RF power at 13.56 MHz was pulsed at about 50% duty cycle for 1 second, and a low k dielectric sublayer about 6 nm thick was deposited primarily from the OMCTS. The RF power at 350 kHz was then pulsed at about 50% duty cycle for 1 second, and a low k dielectric sublayer about 3 nm thick was deposited primarily from DEMS, although some material was deposited from the OMCTS and the ATP. The deposition of the sublayers was repeated until a low k dielectric film of 2000 nm was formed. The low k dielectric film had a k<2.5 and a hardness of about>0.5 GPa.

While the foregoing is directed to embodiments of the present invention, other and further embodiments of the invention may be devised without departing from the basic scope thereof, and the scope thereof is determined by the claims that follow.

What is claimed is:

1. A method of depositing a low k dielectric film on a substrate, comprising:
   exposing two or more compounds to pulsed RF power to deposit alternating low k dielectric sublayers on the substrate, wherein at least one of the two or more compounds is an organosilicon compound, wherein the pulsed RF power comprises two or more frequencies of RF power, and wherein one of the sublayers is deposited substantially from one of the two or more compounds during a first period of pulsed RF power at a first frequency of RF power, and an adjacent sublayer is deposited substantially from another compound of the two or more compounds during a second period of pulsed RF power at a second frequency of RF power.

2. The method of claim 1, wherein one of the two or more frequencies is about 350 kHz and another of the two or more frequencies is about 100 MHz.

3. The method of claim 1, wherein the two or more compounds comprise a hydrocarbon.

4. The method of claim 1, wherein the two or more compounds comprise diethoxymethylsilane and octamethylcyclotetrasiloxane.

5. The method of claim 1, wherein the two or more compounds comprise oxygen.

6. The method of claim 1, wherein the two or more compounds comprise carbon dioxide.

7. The method of claim 1, wherein each sublayer is about 1 nanometer to about 100 nanometers.

8. The method of claim 1, further comprising treating the alternating sublayers with an electron beam.

9. The method of claim 1, wherein the two or more compounds are exposed to the pulsed RF power under conditions such that adjacent sublayers have one or more substantially different mechanical properties selected from the group consisting of compressive stress, tensile stress, modulus, adhesion, and hardness.

10. The method of claim 1, wherein one of the sublayers is deposited substantially from the organosilicon compound.

11. A method of depositing a low k dielectric film on a substrate, comprising:
    simultaneously exposing two or more compounds to pulsed RF power to deposit alternating low k dielectric sublayers on the substrate, wherein at least two of the compounds are organosilicon compounds and the pulsed RF power comprises pulses delivered for a first period of time at a first frequency of RF power and pulses delivered for a second period of time at a second frequency of RF power.

12. The method of claim 11, wherein at least one of the sublayers is a carbon-doped silicon oxide.

13. The method of claim 11, wherein the exposing two or more compounds to pulsed RF power comprises a process selected from the group consisting of chemical vapor deposition and atomic layer deposition.

14. The method of claim 11, wherein one of the sublayers is deposited substantially from one of the two or more compounds during the first period of time, and an adjacent sublayer is deposited substantially from another compound of the two or more compounds during the second period of time.

15. The method of claim 11, wherein the two or more compounds further comprise a hydrocarbon.

16. The method of claim 11, wherein the at least two organosilicon compounds comprise diethoxymethylsilane and octamethylcyclotetrasiloxane.

17. The method of claim 11, wherein the two or more compounds further comprise oxygen.

18. The method of claim 11, wherein the two or more compounds further comprise carbon dioxide.

19. The method of claim 11, further comprising treating the two or more sublayers with an electron beam.

20. The method of claim 11, wherein the two or more compounds are exposed to pulsed RF power under conditions such that adjacent sublayers have one or more substantially different mechanical properties selected from the group consisting of compressive stress, tensile stress, modulus, adhesion, and hardness.

21. The method of claim 11, wherein one of the sublayers is deposited substantially from one organosilicon compound having a structure selected from the group consisting of ring structures, linear structures, and fullerene structures, and an adjacent sublayer is deposited substantially from a second organosilicon compound having a structure that is different from the structure of the first compound and is selected from the group consisting of ring structures, linear structures, and fullerene structures.

22. A low k dielectric film comprising alternating low k dielectric sublayers, formed by a process comprising:
exposing two or more compounds to pulsed RF power to deposit alternating low k dielectric sublayers on the substrate, wherein at least one of the two or more compounds is an organosilicon compound, and wherein the pulsed RF power comprises two or more frequencies of RF power, and wherein one of the sublayers is deposited substantially from one of the two or more compounds during a first period of pulsed RF power at a first frequency of RF power and an adjacent sublayer is deposited substantially from another compound of the two or more compounds during a second period of pulsed RF power at a second frequency of RF power.

23. The low k dielectric film of claim 22, wherein the two or more compounds comprise oxygen.

24. The low k dielectric film of claim 22, further comprising treating the alternating sublayers with an electron beam.

25. A low k dielectric film comprising alternating low k dielectric sublayers, formed by a process comprising:
simultaneously exposing two or more compounds to pulsed RF power to deposit alternating low k dielectric sublayers on the substrate, wherein at least two of the compounds are organosilicon compounds and the pulsed RF power comprises pulses delivered for a first period of time at a first frequency of RF power and pulses delivered for a second period of time at a second frequency of RF power.

26. The low k dielectric film of claim 25, wherein one of the sublayers is deposited substantially from one of the two or more compounds during the first period of time, and an adjacent sublayer is deposited substantially from another compound of the two or more compounds during the second period of time.

27. The low k dielectric film of claim 25, wherein the two or more compounds further comprise oxygen.

28. The low k dielectric film of claim 25, further comprising treating the alternating sublayers with an electron beam.

29. A method of depositing a low k dielectric film on a substrate, comprising:
exposing two or more compounds to pulsed RF power to deposit alternating low k dielectric sublayers on the substrate, wherein at least one of the two or more compounds is an organosilicon compound, the pulsed RF power comprises two or more frequencies of RF power, and one of the two or more frequencies is about 350 kHz and another of the two or more frequencies is about 100 MHz.

30. A method of depositing a low k dielectric film on a substrate, comprising:
exposing two or more compounds to pulsed RF power to deposit alternating low k dielectric sublayers on the substrate, wherein at least one of the two or more compounds is an organosilicon compound, the pulsed RF power comprises two or more frequencies of RF power, and the two or more compounds comprise diethoxymethylsilane and octamethylcyclotetrasiloxane.

31. A method of depositing a low k dielectric film on a substrate, comprising:
exposing two or more compounds to pulsed RF power to deposit alternating low k dielectric sublayers on the substrate, wherein at least one of the two or more compounds is an organosilicon compound, the pulsed RF power comprises two or more frequencies of RF power, and each sublayer is about 1 nanometer to about 100 nanometers.

32. A method of depositing a low k dielectric film on a substrate, comprising:
exposing two or more compounds to pulsed RF power to deposit alternating low k dielectric sublayers on the substrate, wherein at least one of the two or more compounds is an organosilicon compound, and the pulsed RF power comprises two or more frequencies of RF power; and
treating the alternating sublayers with an electron beam.

33. A low k dielectric film comprising alternating low k dielectric sublayers, formed by a process comprising:
exposing two or more compounds to pulsed RF power to deposit alternating low k dielectric sublayers on the substrate, wherein at least one of the two or more compounds is an organosilicon compound, and wherein the pulsed RF power comprises two or more frequencies of RF power; and
treating the alternating sublayers with an electron beam.

* * * * *

UNITED STATES PATENT AND TRADEMARK OFFICE
CERTIFICATE OF CORRECTION

PATENT NO. : 7,011,890 B2 Page 1 of 1
APPLICATION NO. : 10/378783
DATED : March 14, 2006
INVENTOR(S) : Son Van Nguyen and Yi Zheng It is certified that error appears in the above-identified patent and that said Letters Patent is hereby corrected as shown below:

<u>In the Specification</u>

Column 3, Lines 26-27: After "1,1,3,3-tetramethyldisilazane.", delete "tetramethyldisilazane"

<u>In the Claims</u>

Column 9, Claim 22, Line 38: Delete the "and" before "wherein"

Signed and Sealed this

Eighth Day of August, 2006

JON W. DUDAS
*Director of the United States Patent and Trademark Office*